United States Patent [19]
Oga

[11] Patent Number: 5,831,481
[45] Date of Patent: Nov. 3, 1998

[54] PHASE LOCK LOOP CIRCUIT HAVING A BROAD LOOP BAND AND SMALL STEP FREQUENCY

[75] Inventor: Toshiyuki Oga, Tokyo, Japan

[73] Assignee: NEC Corporation, Tokyo, Japan

[21] Appl. No.: 805,501

[22] Filed: Feb. 26, 1997

[30] Foreign Application Priority Data

Feb. 29, 1996 [JP] Japan ................................... 8-042478

[51] Int. Cl.⁶ .................................................. H03L 7/185
[52] U.S. Cl. ............................ 331/1 A; 327/361; 331/25; 331/30
[58] Field of Search ............................... 331/1 A, 25, 30; 327/361

[56] References Cited

U.S. PATENT DOCUMENTS

| | | | |
|---|---|---|---|
| 3,840,822 | 10/1974 | Hoffmann | 331/16 |
| 4,446,446 | 5/1984 | Fowks | 331/25 |
| 4,965,533 | 10/1990 | Gilmore | 331/18 |
| 5,349,310 | 9/1994 | Rieder et al. | 331/18 |

FOREIGN PATENT DOCUMENTS

| | | |
|---|---|---|
| 0454917A1 | 11/1991 | European Pat. Off. . |
| 54-96959 | 7/1979 | Japan . |
| 61-75622 | 4/1986 | Japan . |
| 62-210731 | 9/1987 | Japan . |
| 5-122068 | 5/1993 | Japan . |
| 5-36935 | 5/1993 | Japan . |
| 6-29745 | 2/1994 | Japan . |
| 1 393 124 | 5/1975 | United Kingdom . |
| WO 81/01782 | 6/1981 | WIPO . |

OTHER PUBLICATIONS

Thomas J. Endres et al., "Induced End–of–Life Errors in a Fast Settling PLL", 1993 IEEE International Frequency Control Symposium, Feb. 6, 1993, pp. 261–269.

*Primary Examiner*—Siegfried H. Grimm
*Attorney, Agent, or Firm*—Whitham, Curtis & Whitham

[57] ABSTRACT

A phase lock loop circuit includes an oscillator, a digital mixer, a comparator, a loop amplifier, and a low-pass filter. The oscillator has an oscillation frequency controlled by a control voltage. The digital mixer is constituted by a digital element to output a difference frequency signal between an oscillation output from the oscillator and an input mixing signal. The comparator compares at least the phase of the difference frequency signal output from the digital mixer with that of a reference frequency signal, and outputs a difference signal. The loop amplifier and the low-pass filter generate the control voltage for the voltage controlled oscillator on the basis of the difference signal output from the comparator.

11 Claims, 7 Drawing Sheets

PHASE LOCK LOOP CIRCUIT HAVING A BROAD LOOP BAND AND SMALL STEP FREQUENCY

BACKGROUND OF THE INVENTION

The present invention relates to a PLL (Phase Lock Loop) circuit and, more particularly, to a PLL circuit of a broad loop band and a small step frequency width, which is used in a microwave communication device.

A conventional PLL circuit of this type has been used to attain a high frequency pull-in speed of an oscillation circuit for a communication device, suppression of an output frequency jitter, suppression of phase noise of the oscillator, and an improvement in microphonics resistance. To widen the loop band, the phase comparison frequency of this PLL circuit must be increased, which results in an increase in step frequency used to vary the frequency in a single loop using an integral ratio frequency divider. For this reason, the following method has conventionally been used to realize both a broad loop band and a small step frequency width.

Figure 5:
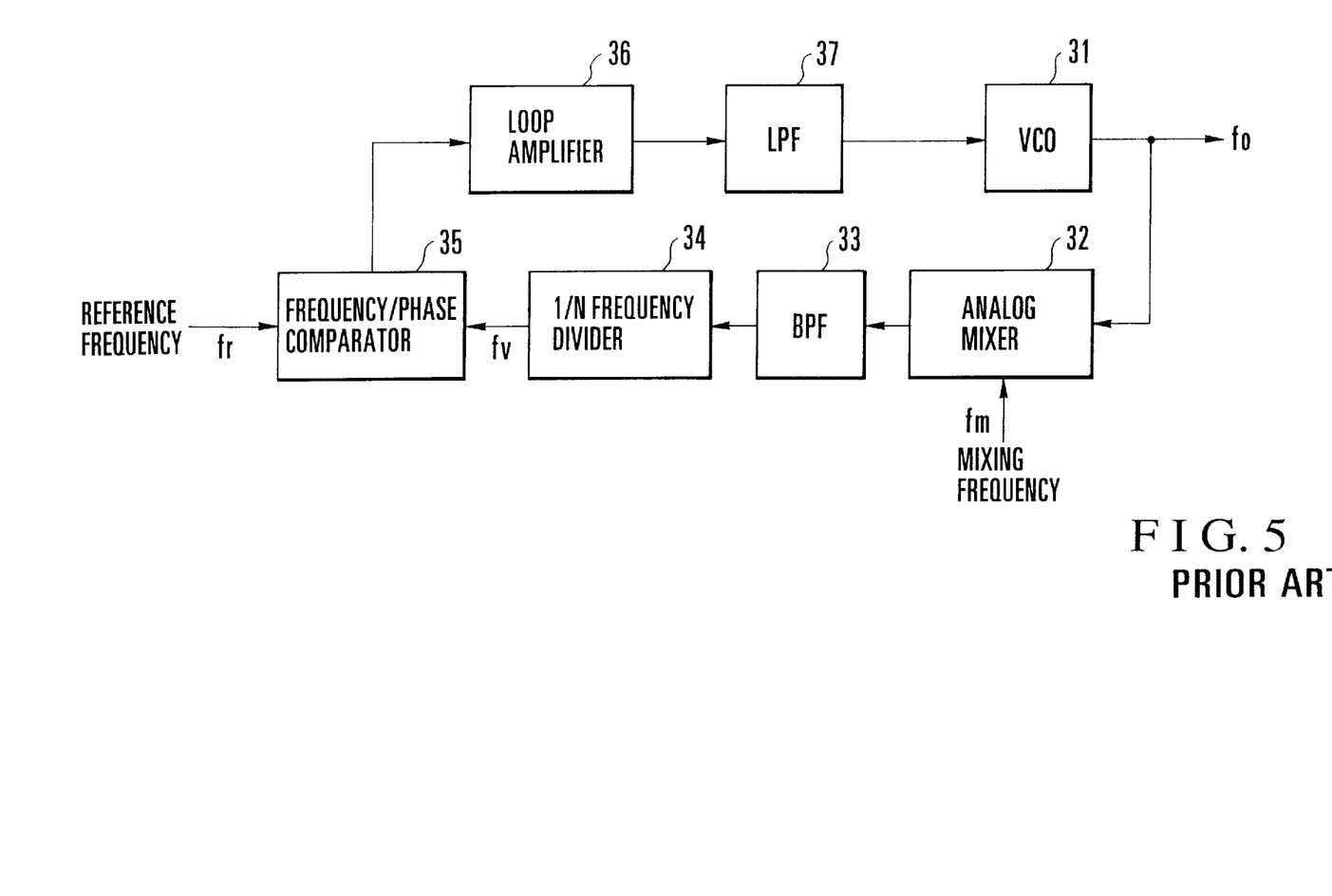
FIG. 5 is a block diagram showing a conventional PLL circuit of a mixdown scheme.

FIG. 5 shows a conventional PLL circuit of a mixdown scheme using an analog mixer. An output frequency fo of a voltage controlled oscillator (VCO) 31 is mixed with a mixing frequency fm in an analog mixer 32, and a sum frequency component and a difference frequency component are generated and output. The difference frequency component output from the analog mixer 32 is selected through a bandpass filter (BPF) 33, and divided by N to a phase comparison frequency fv in a frequency divider 34. The resultant frequency and phase are compared with the frequency and phase of a reference frequency fr in a frequency/phase comparator 35. A difference signal generated by the frequency/phase comparator 35 passes through a loop amplifier 36 for determining loop characteristics and a low-pass filter (LPF) 37 for removing an unnecessary high-frequency feedback signal, and returns to the VCO 31 in order to control the frequency. Coarse adjustment of the output frequency fo is performed with the mixing frequency fm, and fine adjustment thereof is performed by changing a frequency division ratio 1/N of the frequency divider 34.

Figure 6:
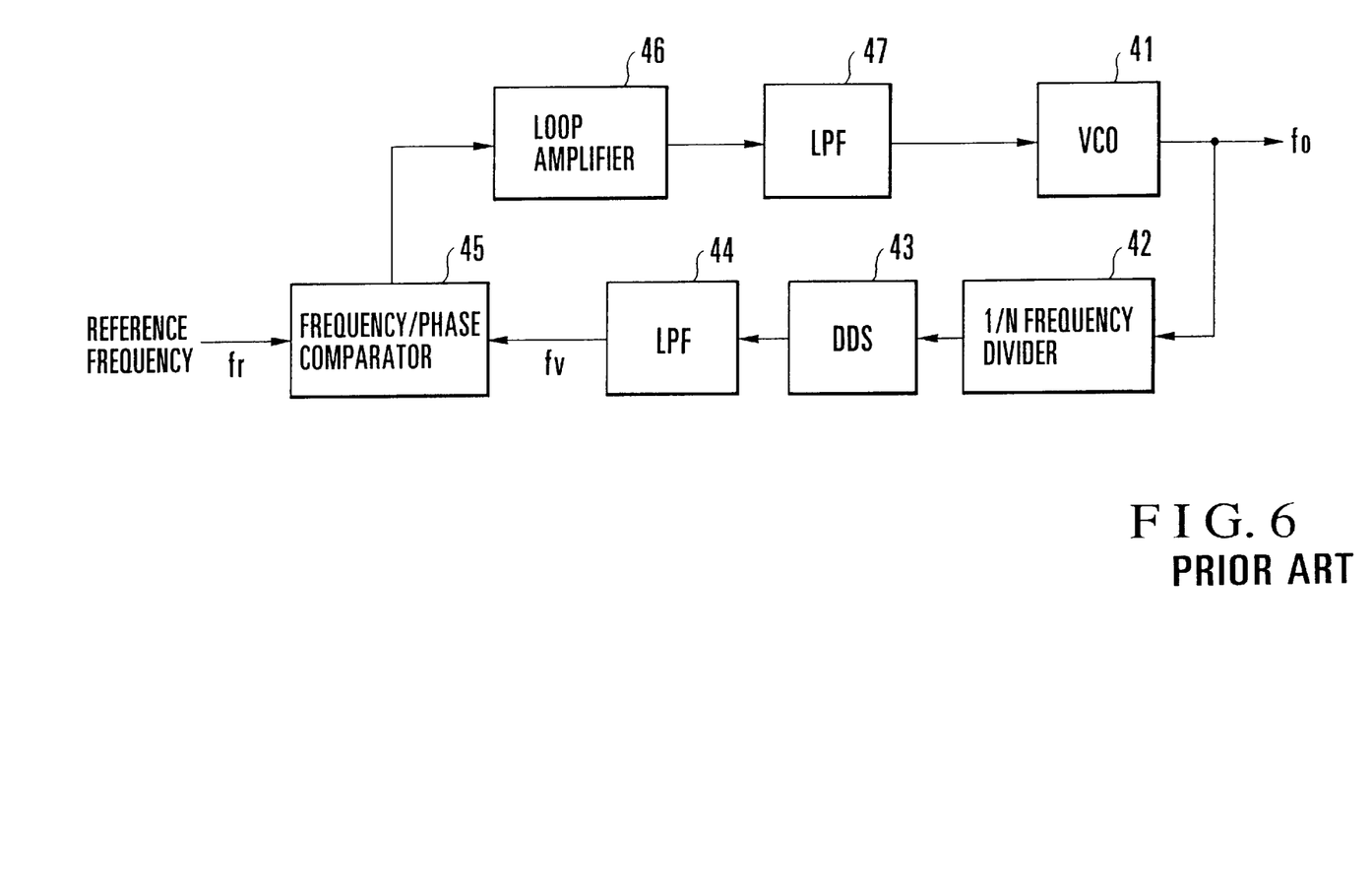
FIG. 6 is a block diagram showing an example of a conventional PLL circuit using a DDS.

FIG. 6 shows an example of a PLL circuit using a direct digital synthesizer (DDS) 43 in a loop. A low phase noise characteristic of the DDS 43 enables fine frequency adjustment. The output frequency fo of a VCO 41 is divided by N in a frequency divider 42 to a frequency which can be input to the DDS 43. The divided frequency is converted to the phase comparison frequency fv by the DDS 43. The output from the DDS 43 is supplied through an LPF 44 in order to prevent a malfunction caused by an aliasing component. The frequency and phase of the output from the LPF 44 are compared with those of the reference frequency fr in a frequency/phase comparator 45. A difference signal returns as a frequency control signal to the VCO 41 through a loop amplifier 46 and an LPF 47. A conventional circuit of this type is disclosed in EP-0 454 917-A1.

Figure 7:
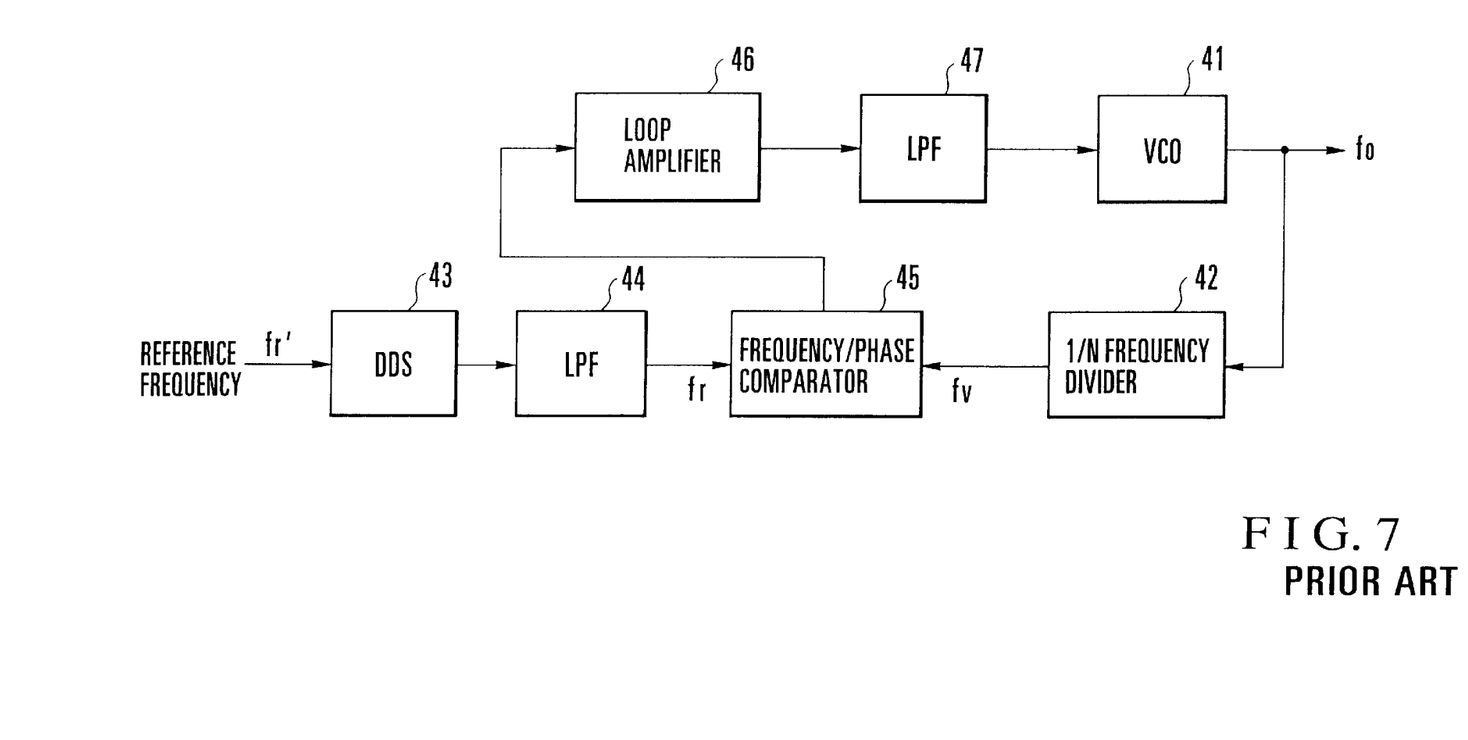
FIG. 7 is a block diagram showing another example of the conventional PLL circuit using the DDS.

FIG. 7 shows a conventional PLL circuit using a DDS 43 for a reference signal system. The same reference numerals as in FIG. 6 denote the same parts, and a description thereof will be omitted. A reference signal fr' is passed through the DDS 43 and an LPF 44 to change the reference frequency fr, thereby controlling the output frequency fo in the PLL circuit. A conventional example is disclosed in U.S. Pat. No. 4,965,533.

In the PLL circuit of the mixdown scheme using the conventional analog mixer shown in FIG. 5, the phase comparison frequency of the frequency/phase comparator 35 limits the loop band. Since this phase comparison frequency must be decreased to decrease the step frequency, it becomes difficult to realize both a broad loop band and a small step frequency width. In addition, a variable-frequency microwave-band oscillator is required to generate the mixing frequency fm, resulting in a large circuit size and a high cost. Further, since both a digital circuit and an analog circuit are used, integration of the circuits is difficult.

On the other hand, in the PLL circuit using the DDS, like the ones shown in FIGS. 6 and 7, it is difficult to suppress a spurious component generated upon the operation of the DDS because the operation principle of the DDS is correction of an output frequency by a fine phase hit and the upper limit of the operation frequency of the DDS is low. The DDS is constituted by a multi-bit counter, a waveform table, a D/A converter, and an LPF. An input frequency is limited by the operation upper limit frequency of any one of these components, and the DDS does not operate in a microwave band. To use the DDS in a microwave-band oscillation circuit, therefore, the PLL circuit inevitably requires a frequency divider. Further, since the DDS generates a spurious component corresponding to a phase hit period, this spurious component is multiplied by a frequency division number and appears in a PLL output.

SUMMARY OF THE INVENTION

It is an object of the present invention to provide a PLL circuit having a broad loop band and a small step frequency width.

It is another object of the present invention to provide a PLL circuit which prevents a degradation in spurious characteristics.

It is still another object of the present invention to provide a PLL circuit which can be integrated.

In order to achieve the above objects, according to the present invention, there is provided a phase lock loop circuit comprising oscillation means having an oscillation frequency controlled by a control voltage, a digital mixer constituted by a digital element to output a difference frequency signal between an oscillation output from the oscillation means and an input mixing signal, comparison means for comparing at least a phase of the difference frequency signal output from the digital mixer with a phase of a reference frequency signal, and outputting a difference signal, and output control means for generating the control voltage for the voltage controlled oscillation means on the basis of the difference signal output from the comparison means.

DESCRIPTION OF THE PREFERRED EMBODIMENT

An embodiment of the present invention will be described below with reference to the accompanying drawings.

Figure 1:
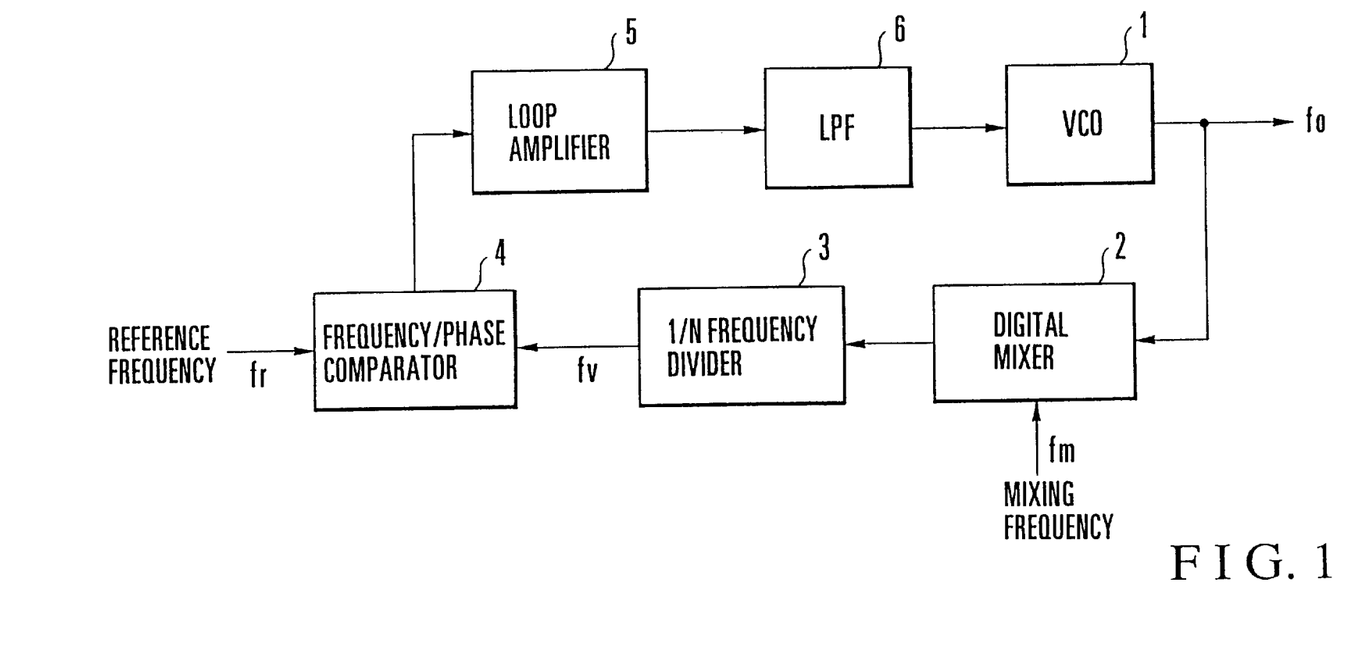
FIG. 1 is a block diagram showing the basic circuit arrangement of a PLL circuit according to the present invention.

FIG. 1 shows the basic arrangement of a PLL circuit according to the present invention. This PLL circuit is constituted by a voltage controlled oscillation means (VCO) 1 having an oscillation frequency controlled by a control voltage, a digital mixer 2 consisting of a digital element as a frequency conversion means for outputting a difference frequency signal between an output frequency fo of the VCO 1 and a mixing frequency fm, a frequency divider 3 for frequency-dividing the output from the digital mixer 2 by N, a frequency/phase comparator 4 for comparing the frequency and phase of the divided difference frequency fv with those of a reference frequency fr, and outputting a difference signal, a loop amplifier 5 for amplifying the difference signal output from the frequency/phase comparator 4 to a required feedback amount, and a low-pass filter (LPF) 6 for removing an unnecessary high-frequency component from an output from the loop amplifier 5 and feeding back the resultant output as a control voltage to the VCO 1.

In the PLL circuit having this arrangement, the output frequency fo of the VCO 1 is mixed with the mixing frequency fm in the digital mixer 2 to generate a difference frequency component. Since the digital mixer 2 does not generate a sum frequency component, unlike an analog mixer, the BPF shown in FIG. 5 can be eliminated. The output from the digital mixer 2 is frequency-divided by N to the phase comparison frequency fv in the frequency divider 3. The frequency and phase of the phase comparison frequency fv are compared with those of the reference frequency fr in the frequency/phase comparator 4. A difference signal obtained in the frequency/phase comparator 4 passes through the loop amplifier 5 and the LPF 6 and returns to the VCO 1 as a control voltage for controlling the frequency. Coarse adjustment of the output frequency fo is performed by changing a frequency division ratio 1/N of the frequency divider 3, and fine adjustment thereof is performed with the frequency fm.

Figure 2:
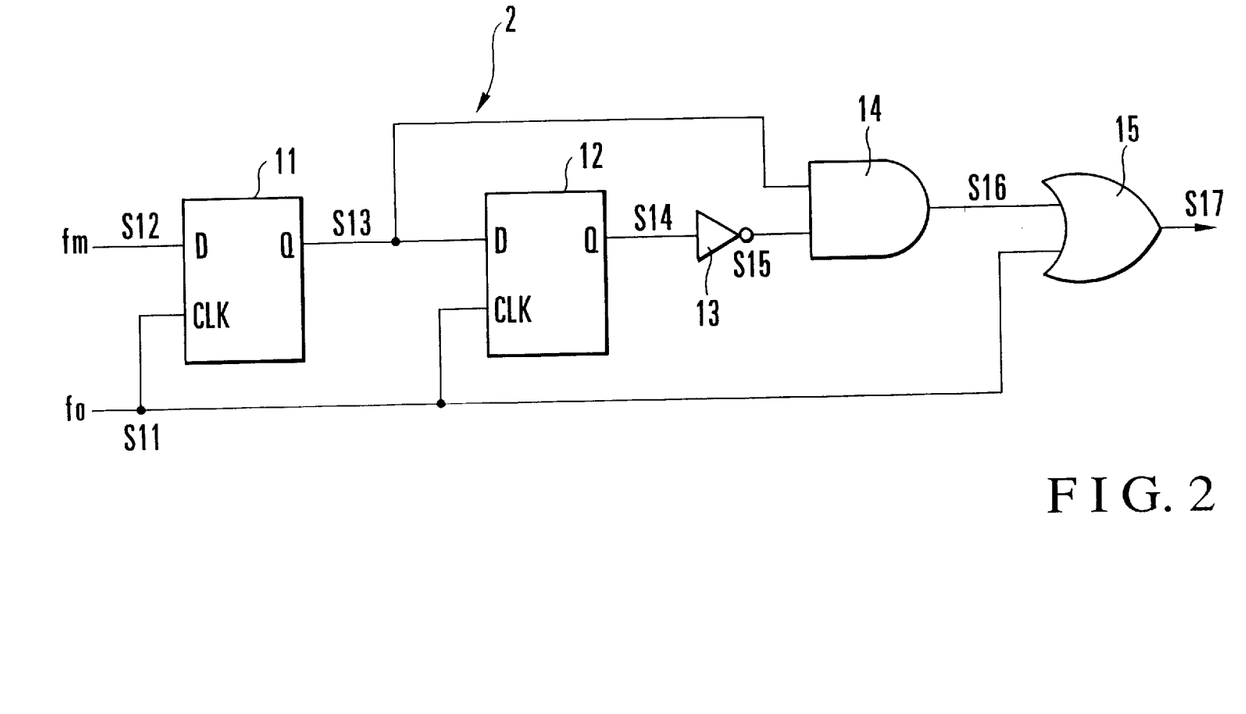
FIG. 2 is a circuit diagram showing an example of a digital mixer.

FIG. 2 shows an example of the digital mixer 2 shown in FIG. 1. The digital mixer 2 is constituted by a first D flip-flop 11 for latching a second input clock signal fm (S12) in synchronism with a first input clock signal fo (S11), a second D flip-flop 12 for latching a Q output (S13) from the first flip-flop 11 in synchronism with the first input clock signal fo (S11), a NOT circuit 13 consisting of an inverter for inverting a Q output S14 from the second flip-flop 12, an AND circuit 14 for calculating the AND between the Q output S13 from the first flip-flop 11 and an output S15 from the NOT circuit 13, and an OR circuit 15 for calculating the OR between the first input clock signal fo (S11) and an output S16 from the AND circuit 14, and outputting a mixer output S17 to the frequency divider 3. Note that the NOT circuit 13 can be omitted by using a Q output from the second flip-flop 12.

Figures 3A, 3B:
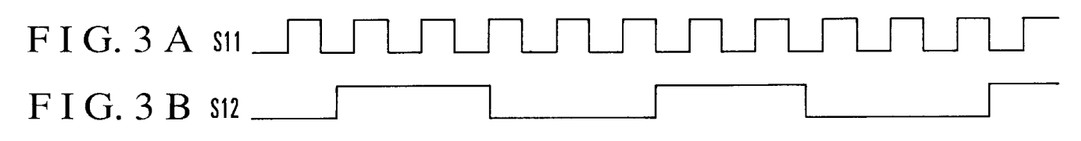
FIGS. 3A to 3G are timing charts for explaining the operation of the digital mixer.
Figure 3C:
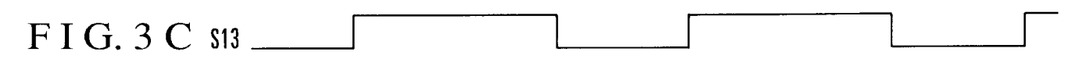
Figure 3D:
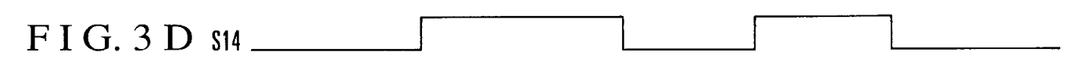
Figure 3E:
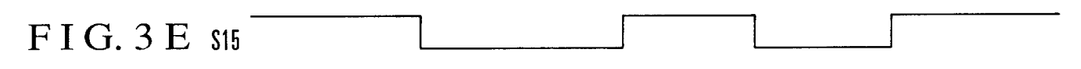
Figure 3F:
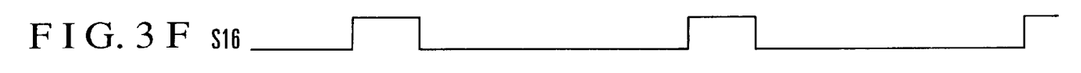
Figure 3G:
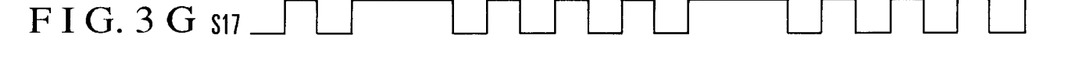

FIGS. 3A to 3G show timing charts of the operations of the respective portions in the digital mixer 2 shown in FIG. 2. The input S11 (FIG. 3A) as the output frequency fo of the VCO 1 is latched at the leading edge of the input S12 (FIG. 3B) as the mixing frequency fm, and the Q output S13 (FIG. 3C) is output from the first flip-flop 11. The Q output S13 from the first flip-flop 11 is latched at the leading edge of the input S12, and the Q output S14 (FIG. 3D) is output from the second flip-flop 12. The inverted output S15 (FIG. 3E) of the Q output S14 from the second flip-flop 12 is input to the AND circuit 14 to calculate the AND with respect to the Q output S13 from the first flip-flop 11. The output S16 (FIG. 3F) from the AND circuit 14 is input to the OR circuit 15 to calculate the OR with respect to the input S11, thereby obtaining the output S17 (FIG. 3G). The frequency of the output S17 serves as a difference frequency between the frequencies fo and fm. In this case, a clock signal having the difference frequency fv between the frequency fo of the input S11 and the frequency fm of the input S12 can be obtained as the output S17 by thinning one pulse of the input S11 when one pulse of the input S12 having the frequency fm overlaps the input S11 having the frequency fo.

Figure 4:
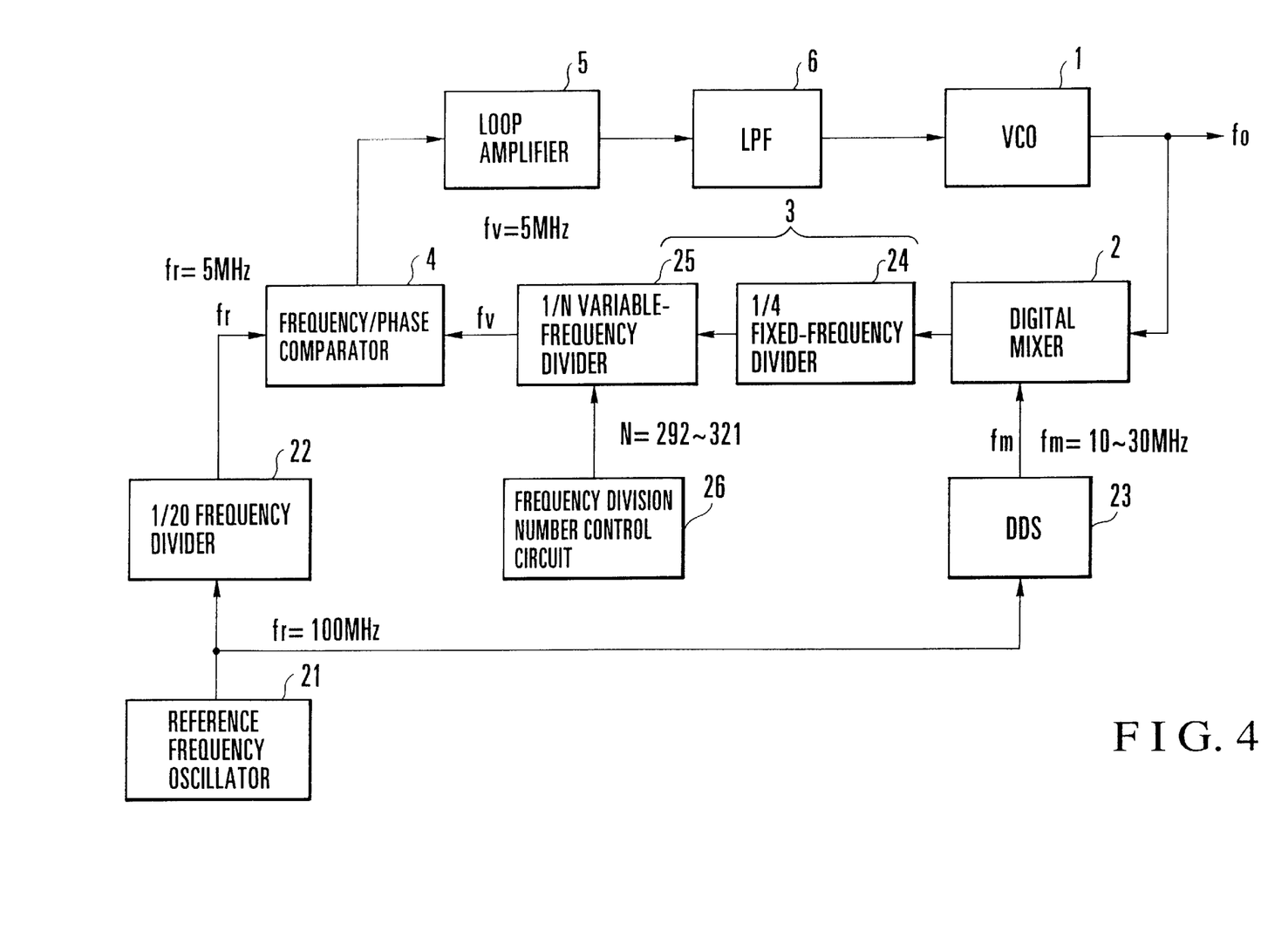
FIG. 4 is a block diagram showing an embodiment of the PLL circuit in FIG. 1.

FIG. 4 shows a detailed example of the PLL circuit in FIG. 1. The same reference numerals as in FIG. 1 denote the same parts. In this example, a reference frequency oscillator 21 and a frequency divider 22 are arranged as a reference signal generation means for generating the reference frequency fr to be input to the frequency/phase comparator 4. An output from the reference frequency oscillator 21 is frequency-divided by 20 in the frequency divider 22, thereby obtaining the reference frequency fr. To generate the mixing frequency fm of the digital mixer 2, this PLL circuit comprises a direct digital synthesizer (DDS) 23 which operates on the basis of the output from the reference frequency oscillator 21. The PLL circuit further comprises, as the frequency divider 3 for obtaining the phase comparison frequency fv by frequency-dividing an output from the digital mixer 2, a fixed-frequency divider 24 having a frequency division ratio fixed to 1/4, and a variable-frequency divider 25 having a frequency division ratio varied by a frequency division number control circuit 26.

In the PLL circuit shown in FIG. 4, the output frequency fo of the VCO 1 is set within a frequency band of 5,850 MHz to 6,450 MHz in units of Hz. The output frequency fo is input to the digital mixer 2 to calculate a difference frequency with respect to the output frequency fm (10 MHz to 30 MHz: 1 Hz step) of the DDS 23, and changed to a step frequency n (n is an integer) times 20 MHz within a frequency band of 5,840 MHz to 6,420 MHz. The output from the digital mixer 2 is frequency-divided by 4 in the fixed-frequency divider 24 to have a frequency of 1,460 MHz to 1,605 MHz. The resultant output is further frequency-divided by 292 to 321 in the variable-frequency divider 25 to obtain 5 MHz as the phase comparison frequency fv.

On the other hand, an oscillation frequency of 100 MHz of the reference frequency oscillator 21 is divided by 20 in the frequency divider 22 to obtain the reference frequency fr of 5 MHz. The frequency and phase of the phase comparison frequency fv are compared with those of the reference frequency fr in the frequency/phase comparator 4. A difference signal generated in the frequency/phase comparator 4 passes through the loop amplifier 5 and the LPF 6 and returns to the VCO 1 as a control voltage for controlling the frequency.

In this PLL circuit, the frequency of the output fo from the VCO 1 is converted by the digital mixer 2. No sum frequency component is generated, and no BPF is required, as described above. In addition, even if the mixing frequency fm used to generate a difference signal with respect to the output fo from the VCO 1 is low, a stable difference frequency signal can be obtained. Therefore, both a broad loop band and a small step frequency width can be realized because an oscillation means having a small frequency step, such as the DDS 23, can be used to generate the mixing frequency, and the frequency/phase comparator 4 can employ a high phase comparison frequency. Moreover, since the DDS 23 is used as a mixing frequency generation means, the mixer 2 is arranged between the VCO 1 and the frequency divider 3, and a spurious component of the DDS 23 is not multiplied by a frequency division number, thereby preventing a degradation in spurious characteristics.

Each of the digital mixer 2, the DDS 23, the frequency divider 3 (24, 25), and the frequency divider 22 can consist of a digital element, which can be integrated with the VCO 1, the frequency/phase comparator 4, the loop amplifier 5, the LPF 6, and the like. As a result, a small-size, low-cost PLL circuit can be attained. Further, since the digital mixer is a simple circuit, it can operate at a high speed.

Note that the present invention may use a decimal frequency division circuit as a mixing frequency generation means, in place of the DDS. In the above embodiment, the frequency and phase of the reference frequency fr are compared with those of the phase comparison frequency fv to obtain a difference signal. Alternatively, only the phases may be compared to obtain a difference signal.

As has been described above, according to the present invention, the mixing frequency can be decreased because a digital mixer is used as a means for converting the frequency of an output from the VCO in the PLL circuit with a mixing signal. Therefore, a mixing frequency generation means having a small frequency step, such as the DDS, can be used, and a high phase comparison frequency can be employed. Both a broad loop band and a small step frequency width can be realized.

What is claimed is:

1. A phase lock loop circuit comprising:

oscillation means having an oscillation frequency controlled by a control voltage;

a digital mixer constituted by a digital element into which is input a first clock signal output from said oscillation means and a second clock signal as a mixing signal, said digital mixer outputting a difference frequency signal having a difference frequency between said first and second clock signals by thinning one pulse of the first clock signal when one pulse of the second clock signal overlaps the first clock signal;

comparison means for comparing at least a phase of the difference frequency signal output from said digital mixer with a phase of a reference frequency signal, and outputting a difference signal; and output control means for generating the control voltage for said voltage controlled oscillation means on the basis of the difference signal output from said comparison means.

2. A circuit according to claim 1, wherein said digital mixer comprises:

first latch means for latching a second input clock signal in synchronism with a first input clock signal;

second latch means for latching an output from said first latch means in synchronism with the first input clock signal;

AND means for calculating an AND between the output from said first latch means and an inverted output from said second latch means; and OR means for calculating an OR between the first input clock signal and an output from said AND means.

3. A circuit according to claim 1, further comprising frequency division means for frequency-dividing the difference frequency signal output from said digital mixer, and outputting a phase comparison frequency to said comparison means.

4. A circuit according to claim 1, further comprising:

reference signal generation means for generating a reference signal;

mixing signal generation means for outputting a mixing signal on the basis of the reference signal output from said reference signal generation means; and frequency division means for frequency-dividing the reference signal output from said reference signal generation means, and outputting a reference frequency signal.

5. A circuit according to claim 4, wherein said mixing signal generation means is constituted by a direct digital synthesizer.

6. A circuit according to claim 4, wherein said mixing signal generation means is constituted by a decimal frequency division circuit.

7. A circuit according to claim 1, wherein said comparison means compares a frequency and phase of the difference frequency signal output from said digital mixer with a frequency and phase of the reference frequency signal, and outputs the difference signal.

8. A phase lock loop circuit comprising:

oscillation means having an oscillation frequency controlled by a control voltage;

a digital mixer constituted by a digital element to output a difference frequency signal between an oscillation output from said oscillation means and an input mixing signal;

comparison means for comparing at least a phase of the difference frequency signal output from said digital mixer with a phase of a reference frequency signal, and outputting a difference signal; and output control means for generating the control voltage for said voltage controlled oscillation means on the basis of the difference signal output from said comparison means, wherein said digital mixer comprises:

first latch means for latching a second input clock signal in synchronism with a first input clock signal;

second latch means for latching an output from said first latch means in synchronism with the first input clock signal;

AND means for calculating an AND between the output from said first latch means and an inverted output from said second latch means; and OR means for calculating an OR between the first input clock signal and an output from said AND means.

9. A phase lock loop circuit comprising:

an oscillation circuit having an oscillation frequency controlled by a control voltage;

a digital mixer constituted by a digital element into which is input a first input clock signal output from said oscillation circuit and a second input clock signal as a mixing signal, said digital mixer outputting a difference frequency signal having a difference frequency between said first and second input clock signals by thinning one pulse of the first input clock signal when one pulse of the second input clock signal overlaps the first input clock signal;

a comparison circuit for comparing at least a phase of the difference frequency signal output from said digital mixer with a phase of a reference frequency signal, and outputting a difference signal; and an output control circuit for generating the control voltage for said oscillation circuit on the basis of the difference signal output from said comparison circuit.

10. A circuit according to claim 9, further comprising:

a frequency division circuit, between said digital mixer and the comparison circuit, which divides the difference frequency signal by a predetermined number;

wherein said predetermined number is controlled to perform coarse adjustment of the oscillation frequency of the oscillation circuit.

11. A circuit according to claim 9, further comprising:

a circuit for adjusting said input mixing signal to perform a fine adjustment of the oscillation frequency of the oscillation circuit.

* * * * *